United States Patent [19]
Joseph

[11] 4,250,474
[45] Feb. 10, 1981

[54] CONTINUOUS BEAM STEERING ACOUSTIC WAVE TRANSDUCER

[75] Inventor: Thomas R. Joseph, Yorba Linda, Calif.

[73] Assignee: Hughes Aircraft Company, Culver City, Calif.

[21] Appl. No.: 78,861

[22] Filed: Sep. 26, 1979

[51] Int. Cl.³ .................. H01L 41/04; G02F 1/11
[52] U.S. Cl. ............................ 333/196; 310/313 A; 350/358
[58] Field of Search ................ 333/150–155, 333/193–196; 350/358–359, 96.13; 310/313

[56] References Cited

U.S. PATENT DOCUMENTS

| | | | |
|---|---|---|---|
| 3,759,603 | 9/1973 | Eschler | 350/358 |
| 3,919,669 | 11/1975 | Hartemann | 350/96.13 X |
| 4,023,120 | 5/1977 | Hartemann | 333/152 |

OTHER PUBLICATIONS

Lean et al.–"Thin-Film Acoustooptic Devices", Proceedings of the IEEE, vol. 64, No. 5, May 1976; pp. 779–788.
Tsai et al–"Wide-Band Guided-Wave Acoustooptic Bragg Diffraction and Devices Using Multiple Tilted Surface Acoustic Waves", Proc. of the IEEE, vol. 64, No. 3, Mar. 1976; pp. 318–328.
Tsai et al.–"High-Performance Acousto-Optic Guided-Light-Beam Device Using Two Tilting Surface Acoustic Waves", Applied Physics Letters, vol. 26, No. 4, Feb. 15, 1975.
R. M. De La Rue et al.–"Frequency-Controlled Beam Steering of Surface Acoustic Waves Using a Stepped Transducer Array", Electronics Letters, Jul. 26, 1973, vol. 9, No. 15; pp. 326–327.

Primary Examiner—Marvin L. Nussbaum
Attorney, Agent, or Firm—John Holtrichter, Jr.; W. H. MacAllister

[57] ABSTRACT

There is hereinafter described an integral transducer geometry which provides for the angle of an acoustic wave beam, interacting with an optical beam, to be varied as a continuous function of the transducer drive energy frequency whereby the efficiency of optical beam deflection remains constant over a large bandwidth.

7 Claims, 7 Drawing Figures

CONTINUOUS BEAM STEERING ACOUSTIC WAVE TRANSDUCER

TECHNICAL FIELD

This invention relates to acoustooptic devices and more particularly to optical beam steering acoustic wave transducers.

BACKGROUND ART

In the past few years, there has been considerable interest exhibited in surface wave type acoustooptic interaction for use as Bragg modulators and deflectors, for mode converters, for fast switches, and the like.

The interaction of guided optical waves and surface acoustic waves in only one direction leads to better interaction efficiency than has been obtainable in bulk wave counterparts. For example, a diffraction efficiency of 85% and a −3 dB bandwidth of 100 MHz, using only 190 mW of drive power has been accomplished using a surface acoustic wave frequency of 180 MHz.

Although diffraction efficiency is very important, bandwidth is the most important characteristic in many important applications, and wide bandwidth has been lacking in single transducer acoustooptic devices. For example, wide bandwidth provides a larger number of scannable spot diameters and a higher switching speed of the deflected light beam. However, in the past where a single transducer design was developed to provide both high diffraction efficiency and wide bandwidth, large RF driving power was required, which power can easily result in failure of the interdigital transducer.

More recently, experiments have been conducted using multiple transducer configurations in what are known as tilted, and phased surface acoustic wave devices. In the tilted system, the interdigital transducers have staggered center frequencies and their propagation axes are tilted with respect to each other. The surface acoustic waves produced by this type of transducer array satisfy the Bragg condition in each frequency band, and thus can provide a broad composite frequency response. In the phased system, all of the transducers have the same center frequency and propagation axis, but the transducers are arranged in a stepped height configuration to introduce a phase shift between adjacent acoustic waves. This allows the resultant wavefront to be scanned by varying the acoustic frequency. Efficient diffraction is then possible over a relatively wide frequency band because scanning of the wavefront enables the composite acoustic beam of large aperture to track the Bragg condition.

A rather thorough description of the single and multiple transducer systems of the prior art may be obtained by viewing such articles as "Wide-Band Guided-Wave Acoustooptic Bragg Diffraction and Devices Using Multiple Tilted Surface Acoustic Waves," by Chen S. Tsai, M. A. Alhaider, Le Trong Nguyen, and Bumman Kim, in the Proceedings of the IEEE, Vol. 64, No. 3, March 1976, and "Thin-Film Acoustooptic Devices" by Eric G. H. Lean, James M. White, and Christopher D. W. Wilkinson, in the Proceedings of the IEEE, Vol. 64, No. 5, May 1976.

In contrast to the techniques used in the prior art to provide both high diffraction efficiency and broad bandwidth, the present technique provides a continuous variation of optical beam angle with frequency in a single transducer configuration to eliminate the problems associated with driving multiple discrete transducers.

SUMMARY OF THE INVENTION

In view of the foregoing factors and conditions characteristic of the prior art, it is a primary object of the present invention to provide a continuous beam steering acoustic transducer.

Another object of the present invention is to provide a wide-band continuous beam steering acoustic wave transducer.

Still another object of the present invention is to provide a continuous beam steering acoustic wave transducer in which the electrode angle is varied to maximize the bandwidth of Bragg interaction.

Yet another object of the present invention is to provide a continuous beam steering acoustic wave transducer that is nonperiodic so as to achieve octave bandwidth.

In accordance with an embodiment of the present invention, a continuous beam steering acoustic wave transducer includes a nonperiodic transducer structure responsive to acoustic energy coupled thereto and having a centerline axis and a plurality of interdigital electrodes with varying interelectrode spacing and with varying angular relationships with respect to the centerline axis. The interelectrode spacing determines which of the electrodes actively relate to any particular frequency of acoustic energy, and the angular relationships with respect to the centerline axis determines the propagation direction associated with the electrodes.

The acoustic wave transducer is adapted to couple acoustic energy to an from both surface wave and bulk wave devices and is particularly useful as a continuous beam steering acoustic wave transducer in acoustooptic device.

Where the transducer in accordance with the invention is designed to produce large (octave) band-widths, the transducer may be oriented such that acoustic energy generated by drive energy having a frequency at one extreme of the transducer's response characteristic does not encounter electrodes active in generating acoustic energy is response to drive energy having a frequency at the other extreme of the transducer's response characteristic.

Also, techniques such as apodization (a variation of the overlap distance between the oppositely extending electrodes) may be utilized to achieve a uniform acoustic wave transducer efficiency.

The features of the present invention which are believed to be novel are set forth with particularity in the appended claims. The present invention, both as to its organization and manner of operation together with further objects and advantages thereof, may best be understood by making reference to the following description taken in conjunction with the accompanying drawings in which like reference characters refer to like elements in the several views.

DETAILED DESCRIPTION OF THE INVENTION

Figure 1:
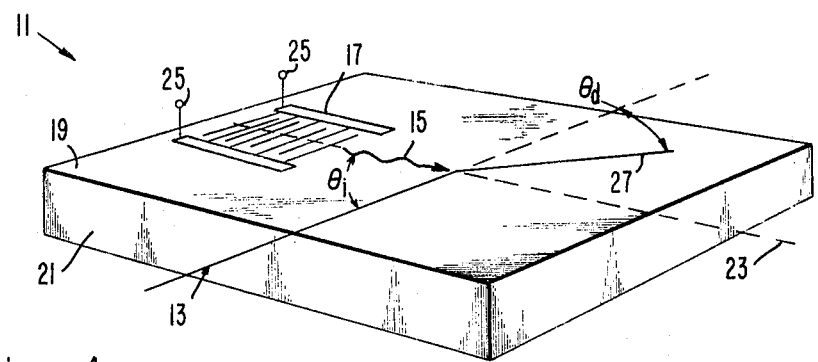
FIG. 1 is a perspective illustration of an acoustooptic Bragg deflection surface acoustic wave device utilizing a transducer constructed in accordance with the present invention.

Referring now to the drawings and more particularly to FIG. 1, there is shown an acoustooptic Bragg diffraction device 11 for obtaining an acoustooptic interaction between a light or laser beam 13 and a surface acoustic wave beam 15 generated by a continuous beam steering wave transducer 17 mounted on the planar surface 19 of a piezoelectric substrate 21.

The characteristics of the interaction are well known in the art and include the diffracted intensity of the light and the deflection angle $\theta_d$, which depend upon the angle, $\theta_i$, between the surface acoustic wave (SAW) beam 15 and the incident light beam 13 which propagates along an axis 23. The angle for maximum diffracted light intensity is determined by the wavelength of the light in the beam 13, the material comprising the substrate 21, and the frequency of the SAW beam 15. To obtain a relatively large bandwidth acoustooptic deflection, it is necessary to have the angle of incidence of the SAW change with frequency. This can be accomplished by allowing the SAW beam 15 to change direction while the axis 23 of the light beam 13 remains fixed.

In accordance with the present invention, the novel interdigital geometry of the transducer 17 provides for the angle of the acoustic beam 15 to be varied as a continuous function of the frequency of the electromagnetic drive energy coupled to the transducer at its terminals 25, with the result that the efficiency of optical beam deflection, producing a deflected light beam 27, remains constant over a large bandwidth.

Figure 2:
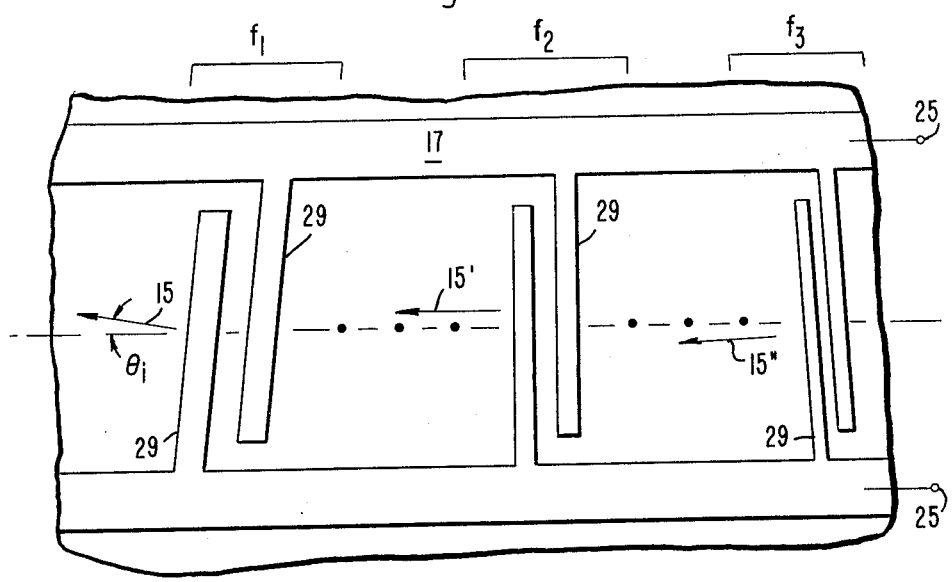
FIG. 2 is a schematic view of a portion of a continuous beam steering acoustic wave transducer, in accordance with the present invention.

FIG. 2 is a simplified drawing of the continuous beam steering SAW transducer which provides the SAW signal 15 whose propagation direction is a function of the drive signal frequency. The interelectrode spacings determine which electrodes 29 are actively generating surface waves for a particular driving frequency coupled to the terminals 25. As shown in this particular embodiment, the periodicity of the electrodes 29 increases from one side to the other of the transducer as does the angle of the electrodes 29 with respect to the center line 31. At any particular frequency of drive energy coupled to the transducer terminals 25, only a few adjacent electrodes will be active in generating the SAW beam 15. These electrodes launch the surface wave at an essentially normal angle to that group of electrodes 29. As a simplified example only, the section of the transducer 17 labeled "f," in FIG. 2 excites waves at an angle $\theta_i$. As the drive energy frequency is changed toward $f_2$, the launch angle moves smoothly toward the center line 31, and smoothly crosses the center line as the drive frequency approaches $f_3$.

Figure 3:
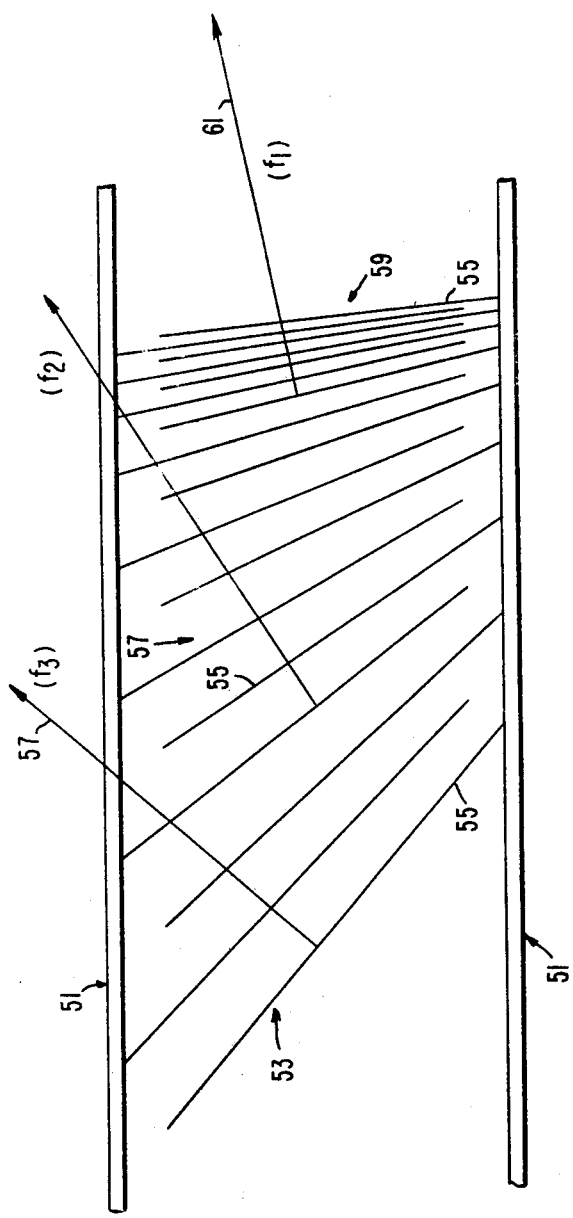
FIG. 3 illustrates another embodiment of the invention, one in which interelectrode reflection for octave bandwidths is reduced.

In previous attempts to obtain this type of transducer behavior, from three to four individual, uniform-periodicity transducers, each designed for a different frequency, were set at different discrete angles and all driven simultaneously, as described in the previously noted article by Chen S. Tsai, et al. In contrast to this prior art technique, the transducer of the present invention provides a continuous variation of acoustic beam angle with drive frequency, and the problems associated with simultaneously driven discrete transducers are eliminated.

Where it is desired to use a beam steering transducer having a large (octave) bandwidth, it has been found that when the transducer is oriented with its centerline axis extending through the SAW/light beam interaction region, the electrodes which are active at one end of the octave range reflect SAW energy produced by electrodes active at the other end of the range. This problem is significant where the higher frequency is equal to or more than twice the lower frequency. The solution to this problem is to skew the transducer as shown in the embodiment of the invention illustrated in FIG. 3. As can be seen in this figure, transducer 51 includes a region 53 of electrodes 55 generally active in launching SAW energy having a frequency of $f_3$ along a beam path 57 and a region 59 generally active in launching SAW energy having a frequency of f, along a beam path 61. It will be noted that the SAW beam 57 does not encounter the electrodes 55 in the region 59 and no reflection occurs.

Figure 4:
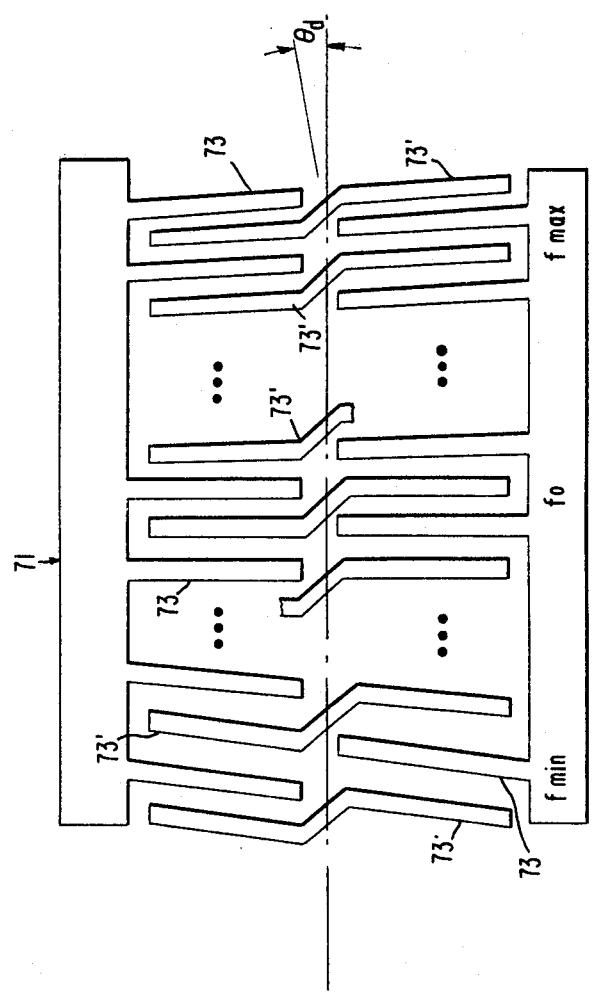
FIG. 4 is a schematically drawn illustration of a continuous beam steering acoustic wave transducer, in accordance with still another embodiment of the present invention.

It should further be understood that techniques such as apodization, which is a variation of the overlap distance between the electrodes to achieve a uniform SAW transducer efficiency, is contemplated for use in conjunction with the teachings of the present invention. Also, a continuous beam steering acoustic were transducer 71 which incorporates "dog-leg" electrodes is within the scope of the invention. This embodiment is shown in FIG. 4 and includes electrodes 73 which vary both as to periodicity and angular relationship. Dog-leg electrodes 73' are utilized here in order to provide a desired transducer impedance characteristic in a manner well known in the art.

Figure 5:
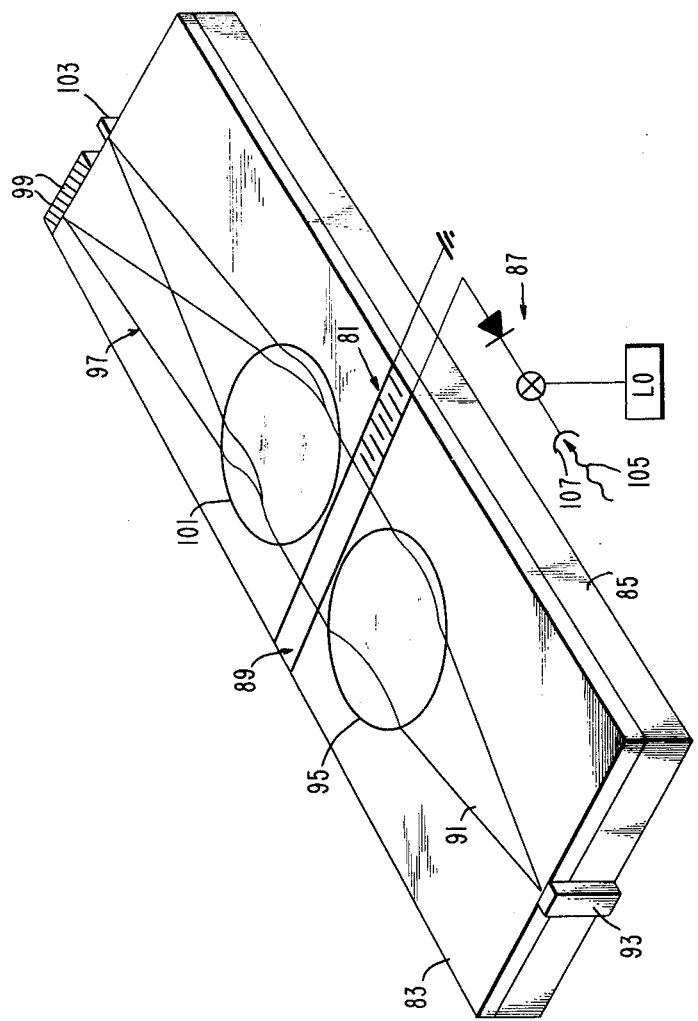
FIG. 5 is a perspective representation of an integrated optic spectrum analyzer utilizing the continuous beam steering acoustic wave transducer constructed in accordance with the invention.

Referring now to an integrated optic spectrum analyzer embodiment of the present invention illustrated in FIG. 5, a continuous beam steering acoustic wave transducer 81 is disposed on a planar surface 83 of a suitable substrate 85 and is coupled to an acoustic wave energy source circuit 87. The transducer 81 launches an acoustic beam 89 in a direction generally transverse to the direction of propagating light frequency beam 91 which is generated by conventional injection laser 93. A circular lense 95 intercepts and generally columnates the dispersing laser beam in a light beam/acoustic beam interaction area, and the interaction between these beams causes a resultant deflected light beam 97 that is detected by a detector array and CCD readout 99. Any undeflected light beam energy and the deflected light beam 97 are intercepted and focused by a second lens 101. For purposes of alignment, undeflected light beam energy is detected by a light detector 103 at the opposite edge of the substrate from the injection laser 93. The detector array 99 includes a plurality of separate light detection sections so that a separate output signal is provided for different deflection angles of the beam 97. Thus, the detector array is able to provide an overall output signal or spectrum analysis of acoustic wave drive energy 105 coupled to the input terminal 107 of the circuit 87.

Figure 6:
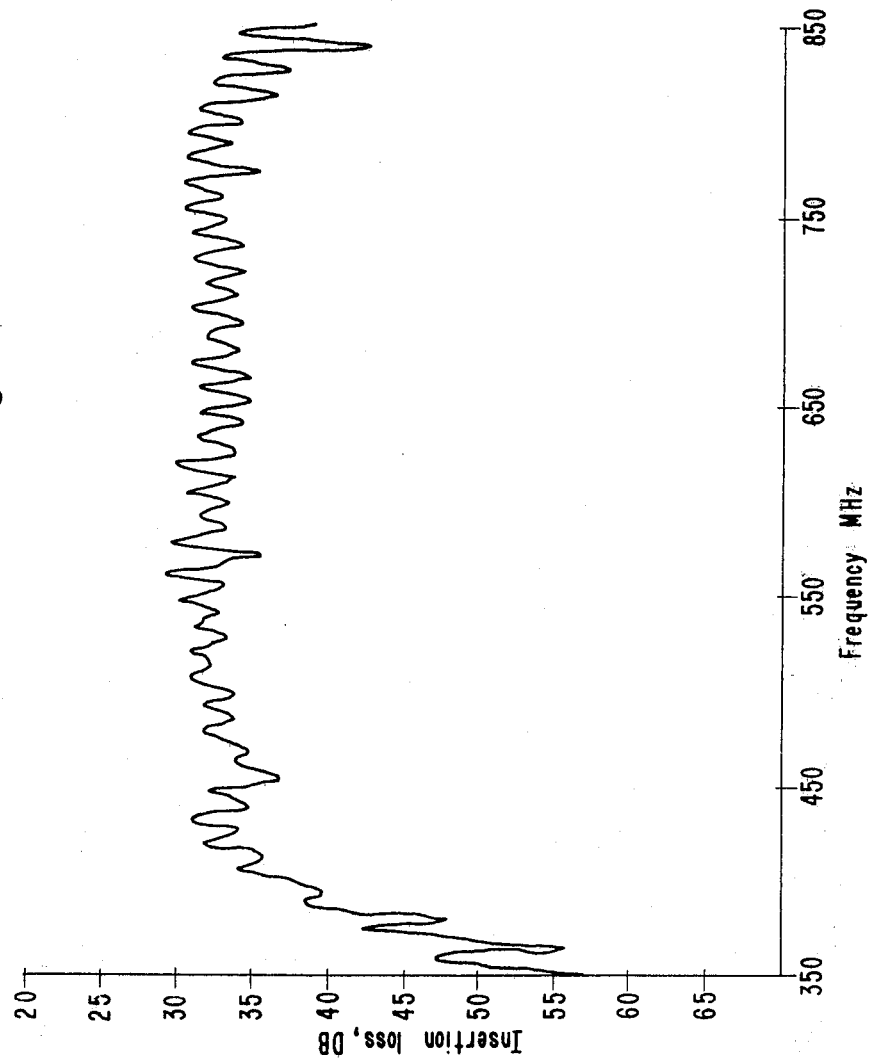
FIG. 6 is a graph showing the measured insertion loss of two continuous beam steering SAW transducers used as an acoustic delay lines.

The measured insertion loss of two operating continuous beam steering SAW transducers constructed in accordance with the present invention and used at each end of an acoustic delay line is shown in FIG. 6. The devices were fabricated on titanium diffused lithium niobate using an aluminum metallization. This data clearly indicates the ability of the invention to convert an RF signal to an acoustic signal and back again, and thus demonstrate that these devices are effective at generating acoustic surface waves which can participate in acoustooptic interactions. The electrodes of these transducers employed both continuous variation in electrode spacing and a continuous tilt of the electrodes to give both a broadband acoustooptic interaction.

Figure 7:
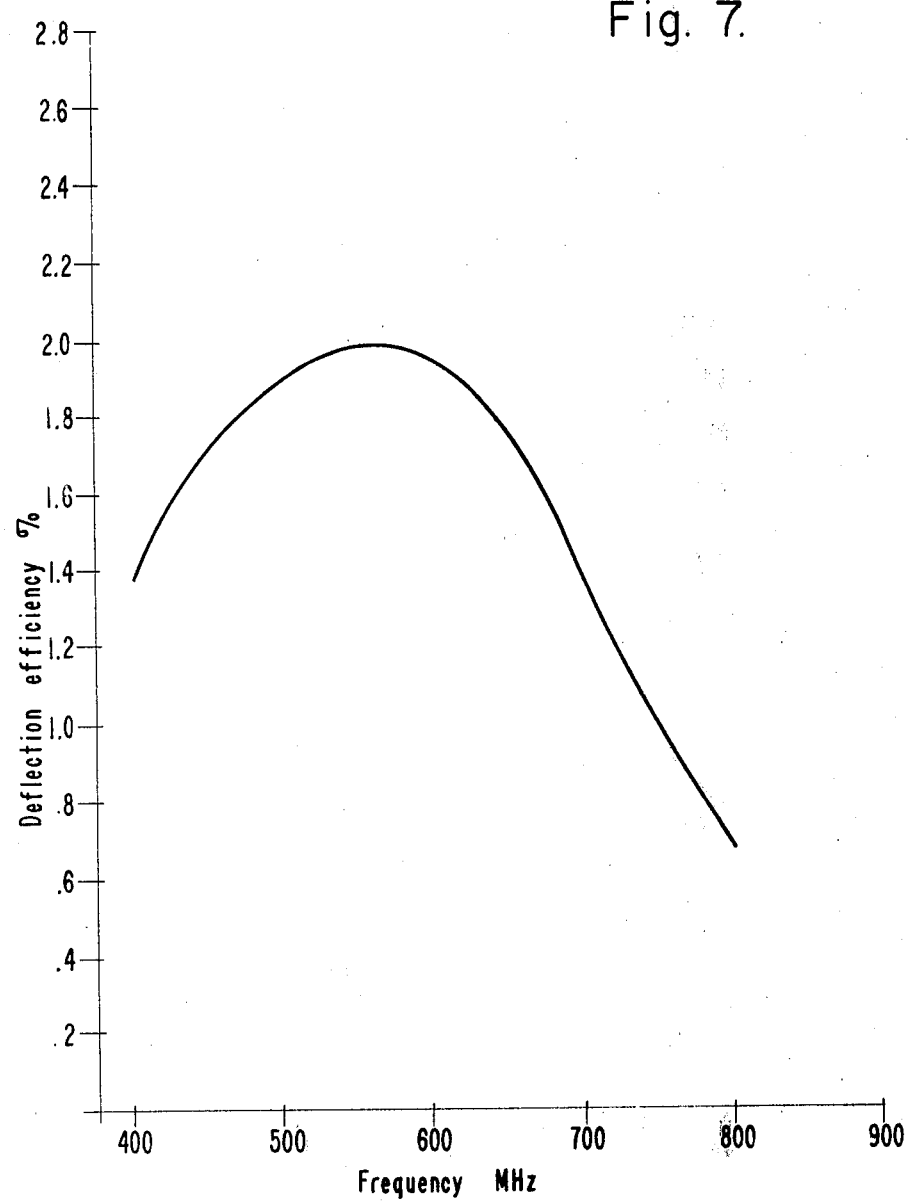
FIG. 7 is a graph showing the acoustooptic Bragg deflection efficiency as a function of frequency.

FIG. 7 is a graph showing the acoustoopic Bragg deflection efficiency as a function of frequency. This is the ratio of the intensity of the light beam that has been deflected by the acoustic wave to the intensity of the light beam that has been deflected by the acoustic wave to the intensity of the undelfected beam. In the electrodes were not tilted, the acoustic waves would be launched in one fixed direction relative to the light beam independent of frequency and the acoustooptic deflection efficiency bandwidth would be determined only by the acoustic bandwidth. For the invention, the acoustic beamwidth was measured to be $17.2 \times 10^{-3}$ inches and the corresponding bandwidth was 157 MHz, while the measured bandwidth was nearly twice this value.

From the foregoing, it should be evident that there has herein been described a unique and useful device which functions both as an acoustic broadband transducer, and moreover, is also effective as a means of increasing the bandwidth of the Bragg interaction between a light beam and an acoustic wave. More advantages of the invention are that the number of electrodes can be selected primarily to satisfy impedance matching conditions to achieve low insertion loss instead of being determined by the required bandwidth, and using larger number of electrodes reduces electrode resistance effects. Further, these transducers can handle larger peak power levels.

Although surface wave devices have been described in detail, it should be understood that the principles of operation of the invention may be advantageously applied to bulk wave structures as well.

I claim:

1. A continuous beam steering acoustic wave transducer, comprising:
   a nonperiodic transducer structure responsive to acoustic energy coupled thereto, said structure having a centerline axis and including a plurality of interdigital electrodes with varying interelectrode spacings and angular relationships with respect to said centerline axis, said interelectrode spacings determining which of said electrodes actively relate to any particular frequency of said acoustic energy, and said angular relationships determining the propagation direction associated with said electrodes.

2. The continuous beam steering acoustic wave transducer according to claim 1, wherein a number of said electrodes have interelectrode spacings are such that they are active in launching acoustic wave energy having a first frequency, and wherein another number of said electrodes have interelectrode spacings such that they are active in launching acoustic wave energy in a second direction in response to electromagnetic drive energy having a second frequency.

3. The coninuous beam steering acoustic wave transducer according to claim 2, wherein a still other numbers of said electrodes have interelectrode spacings such that they are active in launching acoustic wave energy in direction between said first and second directions in response to electromagnetic drive energy have frequencies between said first and second frequencies.

4. The continuous beam steering acoustic wave transducer according to claim 1, wherein said transducer structure includes apodized electrodes.

5. The continuous beam steering acoustic wave transducer according to claim 1, wherein said transducer structure includes dog-leg electrodes.

6. In an acoustooptic device having an acoustic wave launching substrate, a continuous beam steering acoustic wave transducer, comprising:
   a nonperiodic transducer structure responsive to acoustic energy coupled thereto, said structure having a centerline axis and including a plurality of interdigital electrodes with varying interelectrode spacings and angular relationships with respect to said centerline axis, said interelectrode spacings determining the propagation direction associated with said electrodes.

7. An acoustooptic device, comprising:
   a substrate having a planar surface and capable of supporting surface acoustic wave energy;
   a nonperiodic transducer structure responsive to acoustic energy coupled thereto, said structure having a centerline axis and including a plurality of interdigital electrodes with varying interelectrode spacings and angular relationships with respect to said centerline axis.

* * * * *